US011837446B2

(12) United States Patent
Jafarian-Tehrani et al.

(10) Patent No.: US 11,837,446 B2
(45) Date of Patent: Dec. 5, 2023

(54) HIGH POWER CABLE FOR HEATED COMPONENTS IN RF ENVIRONMENT

(71) Applicant: LAM RESEARCH CORPORATION, Fremont, CA (US)

(72) Inventors: Seyed Jafar Jafarian-Tehrani, Fremont, CA (US); Kenneth Walter Finnegan, Sunnyvale, CA (US); Sean O'Brien, San Jose, CA (US); Benson Q. Tong, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 1564 days.

(21) Appl. No.: 16/017,357

(22) Filed: Jun. 25, 2018

(65) Prior Publication Data
US 2019/0035608 A1 Jan. 31, 2019

Related U.S. Application Data

(60) Provisional application No. 62/539,065, filed on Jul. 31, 2017.

(51) Int. Cl.
*H01J 37/32* (2006.01)
*H01L 21/683* (2006.01)
(Continued)

(52) U.S. Cl.
CPC .......... *H01J 37/32724* (2013.01); *H01B 9/00* (2013.01); *H01B 9/006* (2013.01);
(Continued)

(58) Field of Classification Search
CPC .......... H01J 37/32724; H01J 37/32642; H01L 21/67103; H01L 21/6833; H01B 9/006
See application file for complete search history.

(56) References Cited

U.S. PATENT DOCUMENTS

2007/0284344 A1* 12/2007 Todorov ............... H05H 1/46
219/121.54
2008/0174387 A1* 7/2008 Chiang ............... H03H 7/425
333/167
(Continued)

FOREIGN PATENT DOCUMENTS

CN 102076162 A 5/2011
CN 103187943 A 7/2013
(Continued)

OTHER PUBLICATIONS

Translation of First Office Action corresponding to Japanese Application No. 2018-138106 dated Sep. 1, 2022, 14 pages.
(Continued)

*Primary Examiner* — Keath T Chen
*Assistant Examiner* — Margaret Klunk

(57) ABSTRACT

A substrate support includes an edge ring, one or more heating elements, and a cable configured to provide power from a power source to the edge ring and the one or more heating elements. The cable includes a first plurality of wires connected to the edge ring, a second plurality of wires connected to the one or more heating elements, a filter module, wherein the first plurality of wires and the second plurality of wires are twisted together within the filter module, and an isolation device. The isolation device is connected to the first plurality of wires and disposed between the filter module and the edge ring. The isolation device is configured to compensate for a resonance frequency generated during operation of the edge ring and the one or more heating elements.

8 Claims, 4 Drawing Sheets

(51) Int. Cl.
  *H01L 21/67* (2006.01)
  *H01B 9/00* (2006.01)
  *H03H 7/01* (2006.01)

(52) U.S. Cl.
  CPC .. *H01J 37/32577* (2013.01); *H01J 37/32642* (2013.01); *H01L 21/67103* (2013.01); *H01L 21/6833* (2013.01); *H03H 7/01* (2013.01); *H01J 2237/2001* (2013.01); *H01L 21/683* (2013.01)

(56) References Cited

U.S. PATENT DOCUMENTS

| | | | |
|---|---|---|---|
| 2011/0126765 A1 | 6/2011 | Yamazawa et al. | |
| 2011/0229837 A1* | 9/2011 | Migita | H01L 21/6831 156/60 |
| 2012/0032756 A1* | 2/2012 | Long | H05H 1/46 333/181 |
| 2013/0220545 A1 | 8/2013 | Koizumi et al. | |
| 2013/0228323 A1* | 9/2013 | Makabe | F28F 27/02 165/59 |
| 2014/0106573 A1 | 4/2014 | Terasaki et al. | |
| 2014/0263177 A1* | 9/2014 | Povolny | C23C 16/4586 427/535 |
| 2015/0262793 A1* | 9/2015 | Okunishi | H01J 37/32155 156/345.24 |
| 2015/0373783 A1* | 12/2015 | Kitagawa | H01L 21/68757 156/345.52 |
| 2016/0028362 A1 | 1/2016 | Jafarian-Tehrani | |
| 2016/0079038 A1 | 3/2016 | Okunishi | |
| 2016/0198528 A1* | 7/2016 | Kitagawa | H01L 21/67109 156/345.52 |
| 2017/0069464 A1* | 3/2017 | Ye | H01L 21/67103 |
| 2017/0111025 A1* | 4/2017 | Kapoor | H01J 37/32724 |
| 2017/0140958 A1 | 5/2017 | Kitagawa et al. | |

FOREIGN PATENT DOCUMENTS

| | | |
|---|---|---|
| CN | 104918400 A | 9/2015 |
| JP | 2006-196640 A | 7/2006 |
| JP | 2011-135052 A | 7/2011 |
| JP | 2013-104945 A | 5/2013 |
| JP | 2013-175573 A | 9/2013 |
| JP | 2014-075579 A | 4/2014 |
| JP | 2014-229565 A | 12/2014 |
| JP | 2015-173027 A | 10/2015 |
| JP | 2015-220368 A | 12/2015 |
| JP | 2016-027601 A | 2/2016 |

OTHER PUBLICATIONS

Translation of First Office Action corresponding to Taiwanese Patent Application No. 107126277 dated Jul. 28, 2022, 15 pages.
Translation of First Office Action corresponding to Chinese Application No. 201810832761.1 dated Sep. 5, 2022, 14 pages.

* cited by examiner

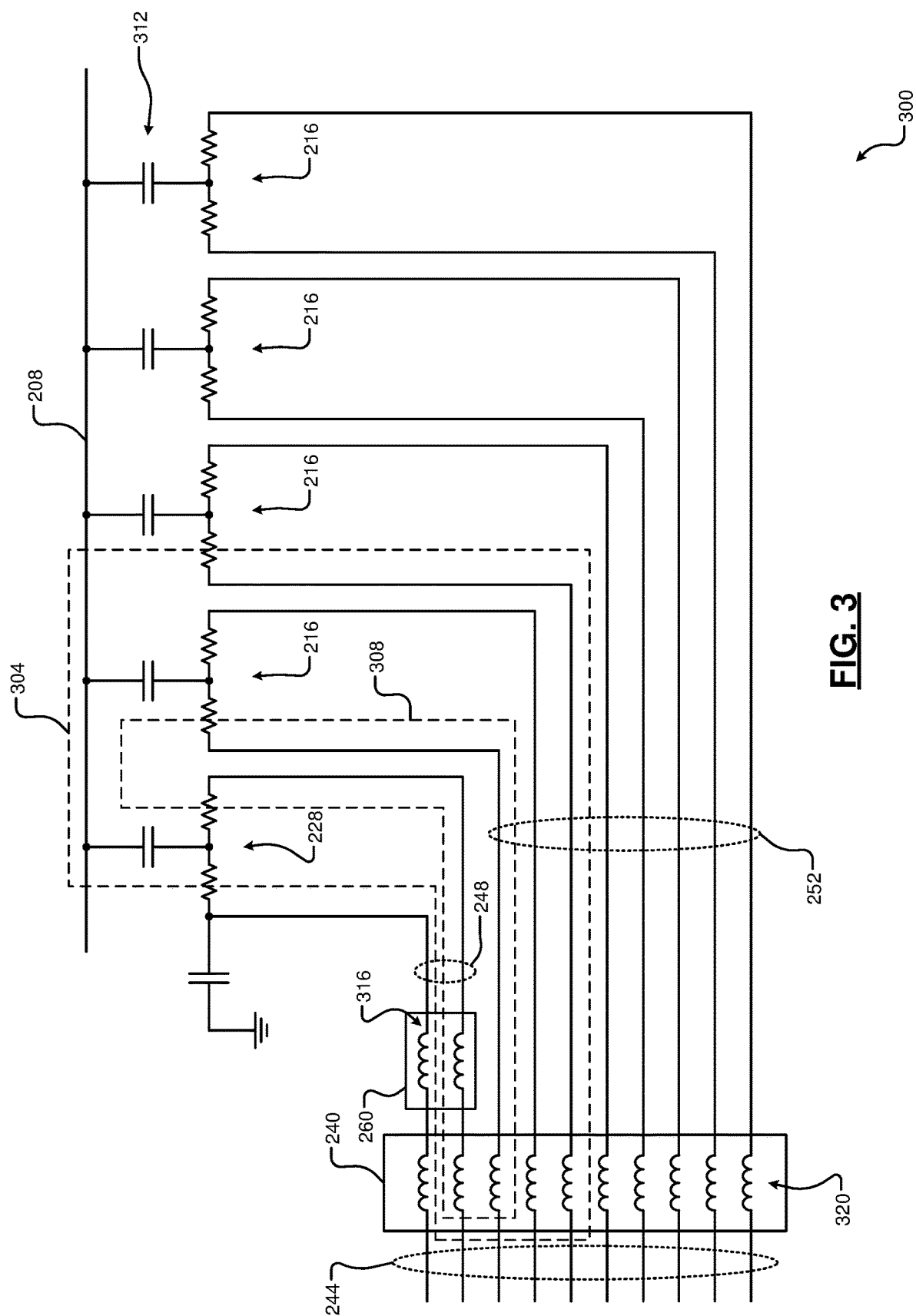

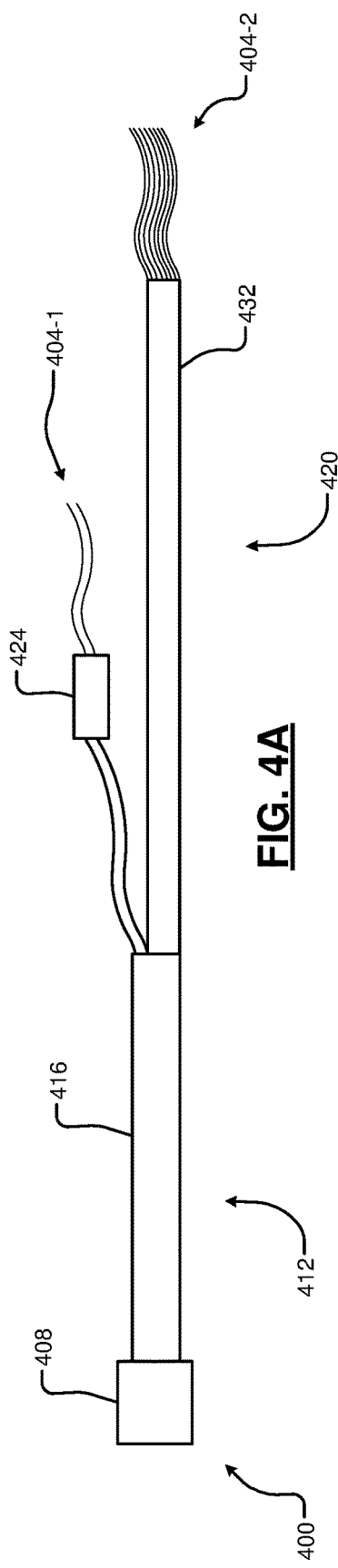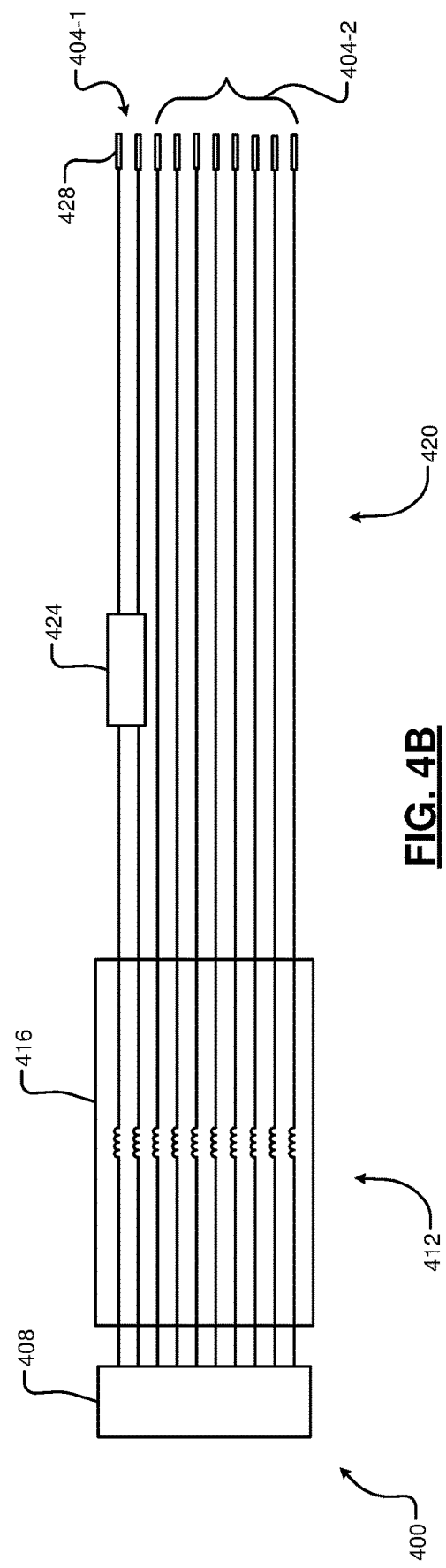

HIGH POWER CABLE FOR HEATED COMPONENTS IN RF ENVIRONMENT

CROSS-REFERENCE TO RELATED APPLICATIONS

This application claims the benefit of U.S. Provisional Application No. 62/539,065, filed on Jul. 31, 2017. The entire disclosure of the application referenced above is incorporated herein by reference.

FIELD

The present disclosure relates to a power cable for heated components in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), dielectric etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

The substrate support may include a ceramic layer arranged to support a wafer. For example, the wafer may be clamped to the ceramic layer during processing. The substrate support may include an edge ring arranged around an outer portion (e.g., outside of and/or adjacent to a perimeter) of the substrate support. The edge ring may be provided to confine plasma to a volume above the substrate, protect the substrate support from erosion caused by the plasma, etc.

SUMMARY

A substrate support includes an edge ring, one or more heating elements, and a cable configured to provide power from a power source to the edge ring and the one or more heating elements. The cable includes a first plurality of wires connected to the edge ring, a second plurality of wires connected to the one or more heating elements, a filter module, wherein the first plurality of wires and the second plurality of wires are twisted together within the filter module, and an isolation device. The isolation device is connected to the first plurality of wires and disposed between the filter module and the edge ring. The isolation device is configured to compensate for a resonance frequency generated during operation of the edge ring and the one or more heating elements.

In other features, the second plurality of wires includes a plurality of pairs of wires, each pair of wires configured to provide power to a respective heating element of the one or more heating elements. The first plurality of wires includes a pair of wires configured to provide power to the edge ring. The substrate support further includes a ceramic layer. The one or more heating elements are arranged within the ceramic layer.

In other features the isolation device is configured to compensate for the resonance frequency by canceling the resonance frequency. The isolation device is configured to compensate for the resonance frequency by shifting the resonance frequency relative to one or more operating frequencies of radio frequency power provided to the substrate support. The isolation device is configured to compensate for the resonance frequency by having an impedance that is selected in accordance with the resonance frequency.

In other features, the isolation device includes an inductor. The inductor is air wound. The inductor is formed around an inductor core. The inductor core is a dielectric core. The inductor core is conductive. The inductor core is one of ferrite and iron. The isolation device includes a transformer. The isolation device includes at least one of a ferrite bead and ferrite bead material. The first plurality of wires and the second plurality of wires are twisted together and wound to form an inductor within the filter module.

A cable and filter system for a substrate support includes a connector configure to connect to a power source for providing power to the substrate support, a first plurality of wires configured to provide power to an edge ring of the substrate support, a second plurality of wires configured to provide power to one or more heating elements of the substrate support, a filter module, and an isolation device. The first plurality of wires and the second plurality of wires are twisted together within the filter module. The isolation device is connected to the first plurality of wires and is external to the filter module. The isolation device is configured to compensate for a resonance frequency generated during operation of the edge ring and the one or more heating elements.

In other features, the isolation device includes at least one of an inductor and a transformer. The first plurality of wires and the second plurality of wires are twisted together around an inductor core within the filter module.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 is an example circuit schematic of a cable and filter system according to the present disclosure.

FIG. 4A is an example cable according to the present disclosure.

FIG. 4B is a simplified schematic of the cable of FIG. 4A.

In the drawings, reference numbers may be reused to identify similar and/or identical elements.

DETAILED DESCRIPTION

A processing chamber of a substrate processing system may include heated components including, but not limited to, an electrode (e.g., a ceramic layer or other heated layer of a substrate support), an edge ring of the substrate support, etc. A radio frequency (RF) plasma environment such as a processing chamber may include one or more high power cable and filter systems to provide direct current (DC) or low frequency (e.g., 47 Hz-400 Hz) power to the heated electrode and/or edge ring. For example only, the delivered power may range from 1 watt to several kilowatts (e.g., 8 kilowatts).

In some examples, two or more components (e.g., both the electrode and the edge ring) are heated. For example, heating elements may be integrated within the electrode and/or edge ring. Power is supplied to the heating elements of the edge ring and the electrode via respective (i.e., multiple) cable and filter systems. Multiple cable and filter systems increase cost and manufacturing complexity and occupy a larger space within the substrate support.

RF power is also supplied (e.g., via an RF generating/power delivery system) to a conductive baseplate of the substrate support to generate plasma within the processing chamber. In some examples, coupling characteristics of respective heating elements of the electrode and the edge ring may be similar such that their respective impedances relative to the RF generating system are also similar. However, electrode and edge ring heating elements may cause local resonances around operating frequencies of the RF generating system, causing an impedance shift. Such an impedance shift may impair the operation of the RF generating system. For example, the impedance shift may draw power away from plasma generation, reduce etch rates by 15-60%, cause wafer non-uniformity, etc.

A combined heater and filter system according to the principles of the present disclosure is configured to compensate for impedances present in and around a heated electrode and edge ring in a substrate processing system. For example, the cable delivery and filter system may include a single power delivery cable provided between a common filter and the substrate support to deliver power to the heating elements of both the electrode and the edge ring. In some examples, the system may include an RF blocking or isolation device (e.g., an inductor having a value selected according to various impedances of the system) to increase the impedance at the edge ring. In this manner, low frequency or DC power may be provided to power the heating elements without interfering with the RF generating system.

Figure 1:
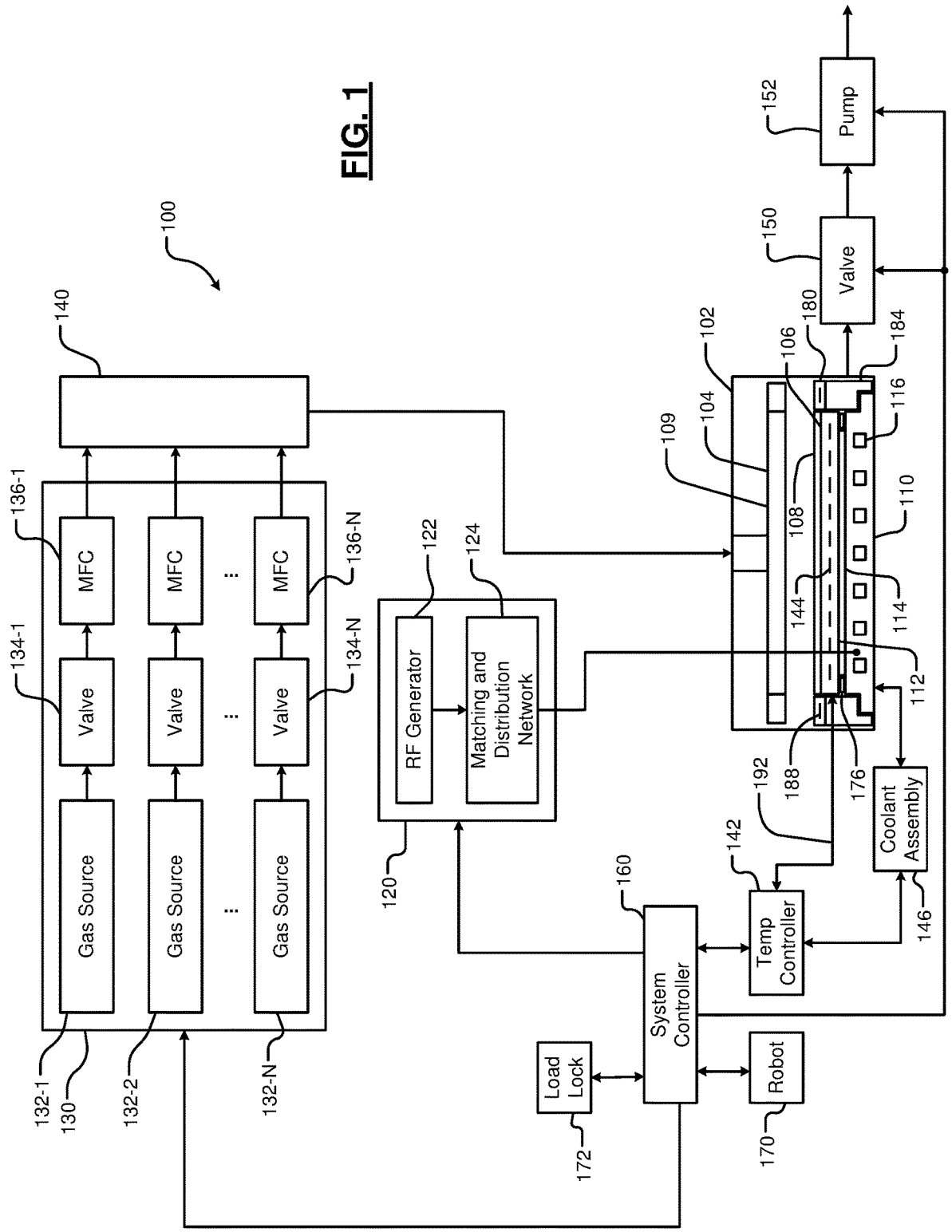
FIG. 1 is a functional block diagram of an example processing chamber according to the present disclosure.

Referring now to FIG. 1, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber 102. A base portion is generally cylindrical and extends radially outwardly from an opposite end of the stem portion at a location that is spaced from the top surface of the processing chamber 102. A substrate-facing surface or faceplate of the base portion of the showerhead 109 includes a plurality of holes through which process gas or purge gas flows. Alternately, the upper electrode 104 may include a conducting plate and the process gases may be introduced in another manner.

The substrate support 106 includes a conductive baseplate 110. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110. The baseplate 110, the thermal resistance layer 114 and the ceramic layer 112 collectively act as a lower electrode.

An RF generating system 120 generates and provides RF power (e.g., as a voltage source, current source, etc.) to one of the upper electrode 104 and the lower electrode (e.g., the baseplate 110, the thermal resistance layer 114 and the ceramic layer 112 of the substrate support 106). For example purposes only, the output of the RF generating system 120 will be described herein as an RF voltage. The other one of the upper electrode 104 and the lower electrode may be DC grounded, AC grounded or floating. As shown, the RF generating system 120 provides the RF voltage to the baseplate 110 corresponding to the lower electrode. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources 132 supply one or more precursors and mixtures thereof. The gas sources 132 may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements 144, such as thermal control elements (TCEs) arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108. For example, the temperature controller 142 may correspond to a power supply, and/or may control a power supply (not shown) external to the temperature controller 142 to provide power to the heating elements 144.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

The substrate support 106 includes an edge ring 180. The edge ring 180 may correspond to a top ring, which may be supported by a bottom ring 184. The edge ring 180 may include one or more heating elements 188. Accordingly, the temperature controller 142 may control power delivered to both the heating elements 144 of the ceramic layer 112 as well as the heating elements 188 of the edge ring 180. In the substrate processing system 100 according to the principles of the present disclosure, the temperature controller 142 provides power to the heating elements 144 and 188 via a shared cable and filter system (e.g., including a common filter module, not shown in FIG. 1, and power delivery cable 192) as described below in more detail.

Figure 2:
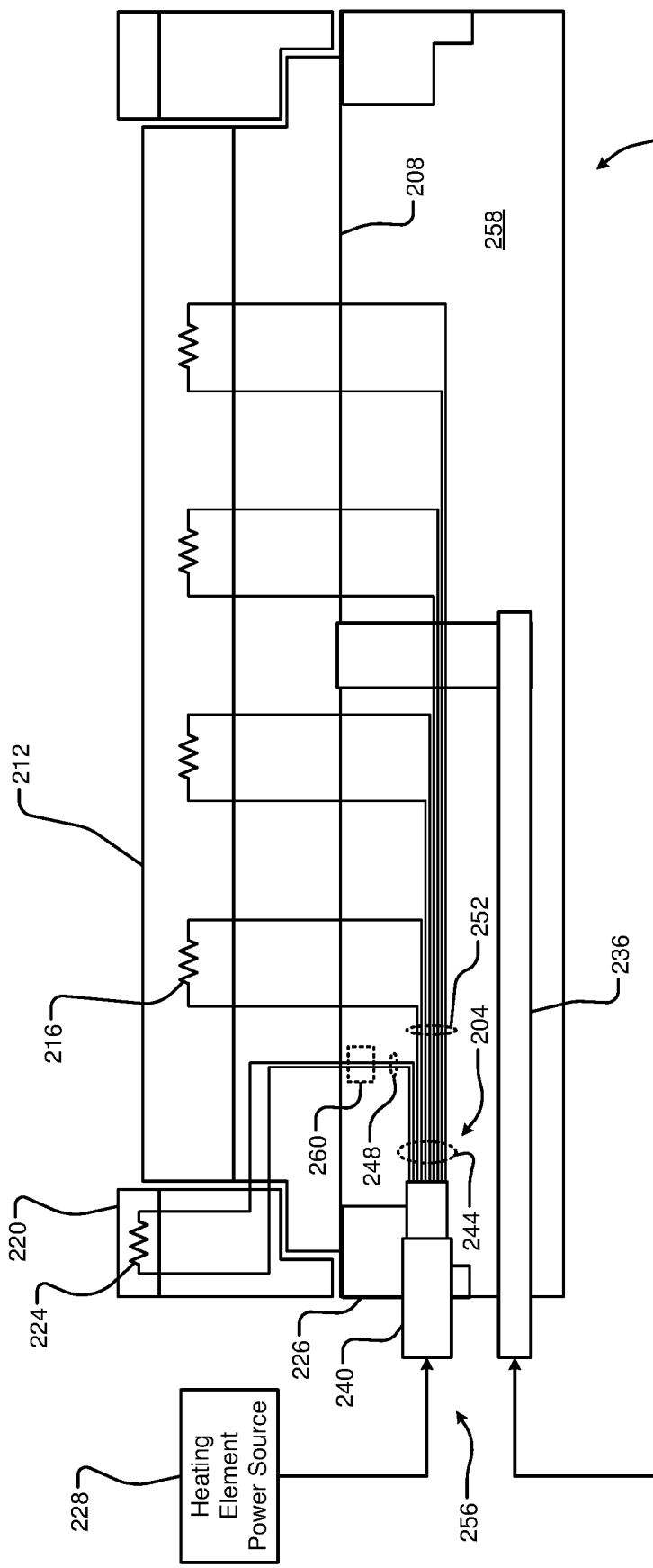
FIG. 2 shows an example substrate support including a cable and filter system according to the present disclosure.

Referring now to FIG. 2, a simplified example substrate support 200 including a cable and filter system (which may be referred to simply as "the cable") 204 according to the principles of the present disclosure is shown in more detail. The substrate support 200 includes a conductive baseplate 208 and a ceramic layer 212 (together corresponding to a lower electrode) including one or more heating elements 216. An edge ring 220 is arranged to surround the ceramic layer 212 and includes one or more heating elements 224. As shown, the ceramic layer 212 includes four of the heating elements 216 (e.g., corresponding to an inner zone, a middle inner zone, a middle outer zone, and an outer zone of a plurality of concentric annular zones) and the edge ring 220 includes one of the heating elements 224. In some examples, the baseplate 208 may be arranged on an insulating ring 226.

The cable and filter system 204 provides power (e.g., DC or low frequency AC voltage) from a heating element power source 228 to the heating elements 216 and 224. For example only, the heating element power source 228 corresponds to a power source controlled by the temperature controller 142 of FIG. 1. Conversely, an RF power source 232 provides RF power to the conductive baseplate 208 via RF delivery line 236 (e.g., a coaxial wire, an RF hollow tube system, etc.). For example, the RF power source 232 corresponds to the RF generating system 120 of FIG. 1. In some configurations, proximity between the cable 204, the RF delivery line 236, the heating elements 216 and 224, and/or other components within the substrate support 200 may interfere with delivery of RF power. For example, components of the cable 204 and the heating elements 216 and 224 may cause local resonances around operating frequencies of the RF power provided to the baseplate 208, causing RF power to be drawn out of the baseplate 208. Accordingly, the cable 204 according to the present disclosure implements various features to compensate for these local resonances and thereby minimize RF power loss.

The cable and filter system 204 includes a filter module 240 and a plurality of (e.g., ten) wires 244 for providing power to the heating elements 216 and 224. For example, the plurality of wires 244 includes a pair of wires 248 for providing power to the heating element 224 of the edge ring 220 and four pairs of wires 252 for providing power to the heating elements 216 of the ceramic layer 212. The plurality of wires 244 may be twisted together in a first portion 256 of the cable 204 from the heating element power source 228 to, and inside of, the filter module 240 (e.g., from outside of the substrate support 200 to an interior 258 of the substrate support 200). In some examples, the filter module 240 includes, inter alia, a main filtering inductor corresponding to the twisted together wires 244 coiled around an inductor core. An example filter system can be found in U.S. Pat. Pub. No. 2016/0028362, which is incorporated herein in its entirety.

Within the substrate support 200, the singe pair of wires 248 is separated from the four pairs of wires 252 (i.e., removed from the twisted plurality of wires 244) to be routed through the substrate support 200 to the heating element 224 of the edge ring 220. Conversely, the four pairs of wires 252 are routed through the substrate support 200 to the heating elements 216 of the ceramic layer 212. In the cable and filter system 204 according to the principles of the present disclosure, the separated, single pair of wires 248 implements a frequency isolation or cancellation device 260 as described below in more detail.

Referring now to FIG. 3 and with continued reference to FIG. 2, an example circuit schematic 300 of the cable and filter system 204 according to the present disclosure is shown. As one example, local resonance frequencies may be generated between circuit loops 304 and 308. For example, the local resonance frequencies may be caused in part by coupling between the heating elements 224 of the edge ring 220 and the baseplate 208 etc. (e.g., due to capacitance coupling between the baseplate 208 and other structures as indicated by various capacitances 312). Accordingly, the frequency isolation device 260 is provided to compensate for (e.g., cancel out, isolate, block, etc.) the generated resonance frequencies to preserve the desired RF power delivered to the baseplate 208.

In one example (as shown), the frequency isolation device 260 corresponds to an inductor 316. For example, the separated, single pair of wires 248 may be twisted together and coiled around an inductor core, air wound, etc. The inductor core may be dielectric, conductive, magnetic (ferrite, ferrite bead, iron), etc. In this example, an impedance of the frequency isolation device 260 is selected according to the generated resonance frequency (e.g., by selecting an inductance value of the inductor 316 to achieve a desired impedance). In other words, the impedance of the frequency isolation device 260 is selected to compensate for the generated resonance frequency (e.g., by cancelling the resonance frequency, shifting the resonance frequency to a different band relative to an operating frequency of the RF power, etc.). For example, the impedance may be selected according to the capacitances 312, an inductance of the edge ring 220, inductances of wires within the loops 304 and 308 (e.g., inductances of the wires 248 and selected ones of the wires 252 nearest to the wires 248 within the substrate support 200), an inductance of a main inductor 320 of the filter module 240, etc.

Although described above in an example as an inductor 316, other implementations of the frequency isolation device 260 may be used. For example, the frequency isolation device 260 may include a T network, additional inductors, an inductor/capacitor circuit, a transformer/inductor circuit, etc. In some examples, a capacitance of the edge ring 220 may be increased. Accordingly, in the above example, the inductance value of the inductor 316 may be selected according to the desired impedance of the frequency isolation device 260 to compensate for the generated resonance frequency while in other examples, other characteristics (e.g., resistances of a T network, transformer characteristics, inductance and/or capacitance values, etc.) of the frequency isolation device 260 may be selected to achieve the desired impedance.

Referring now to FIG. 4A, an example cable 400 corresponding to the cable and filter system 204 of FIGS. 2 and 3 is shown. The cable 400 is shown schematically in FIG. 4B. In this example, the cable 400 includes ten wires (e.g., two wires 404-1 configured to provide power to a heating element of an edge ring and eight wires 404-2 configured to provide power to heating elements of a substrate support, referred to collectively as wires 404). The cable 400 includes connector 408 configured to connect to a power source external to the substrate support (e.g., the heating element power source 228). A first portion 412 of the cable 400 includes a filter module 416. The wires 404 are twisted together in the filter module 416. For example, the wires 404 are twisted together in a coaxial manner around a core (e.g., an inductor core, a fiberglass core, etc.).

In a second portion 420 of the cable 400, the wires 404-1 are separated from the wires 404-2 and connected to an isolation device 424. The isolation device 424 includes structure (e.g., one or more inductors, a T network, an inductor/capacitor circuit, a transformer/inductor circuit, etc.) configured to compensate for resonance frequencies as described above in FIGS. 2 and 3. Ends of each of the wires 404 may include pins 428 configured to connect the wires 404 to terminals of respective heating elements of the substrate support. Portions of the cable 400 may include one or more layers of insulation 432.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet.

The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support, comprising:
   an edge ring;
   a heater element arranged within the edge ring;
   a ceramic layer;
   at least one heating element arranged within the ceramic layer; and
   a cable configured to provide power from a power source to the heater element within the edge ring and the at least one heating element within the ceramic layer, wherein the cable includes, within the cable,
   a first plurality of wires connected to the heater element within the edge ring, wherein the first plurality of wires includes a pair of wires configured to provide power to the heater element within the edge ring,
   a second plurality of wires connected to the at least one heating element within the ceramic layer,
   a filter module, wherein the first plurality of wires and the second plurality of wires are twisted together within the filter module, and
   an isolation device connected only to the first plurality of wires between the filter module and the heater element within the edge ring, wherein the isolation device is configured to compensate for a resonance frequency generated during operation of the heater element within the edge ring and the at least one heating element within the ceramic layer, wherein the isolation device includes an inductor, wherein the inductor is formed around an inductor core, and wherein the inductor core is a dielectric core.

2. The substrate support of claim 1, wherein the at least one heating element comprises to a plurality of heating elements, and the second plurality of wires includes a plurality of pairs of wires each configured to provide power to a respective heating element of the plurality of heating elements.

3. The substrate support of claim 1, wherein, to compensate for the resonance frequency, the isolation device is configured to cancel the resonance frequency.

4. The substrate support of claim 1, wherein, to compensate for the resonance frequency, the isolation device is configured to shift the resonance frequency relative to operating frequencies of radio frequency power provided to the substrate support.

5. The substrate support of claim 1, wherein, to compensate for the resonance frequency, the isolation device has an impedance that is selected in accordance with the resonance frequency.

6. The substrate support of claim 1, wherein the isolation device includes a transformer.

7. The substrate support of claim 1, wherein the isolation device includes at least one of a ferrite bead and ferrite bead material.

8. The substrate support of claim 1, wherein the first plurality of wires and the second plurality of wires are twisted together and wound around a core to form a filtering inductor within the filter module.

* * * * *